United States Patent
Tamura (10) Patent No.: US 8,134,485 B2
(45) Date of Patent: Mar. 13, 2012

(54) DEVICE FOR CONVERTING ANALOG SIGNAL INTO DIGITAL VALUES AND CORRECTING THE VALUES

(75) Inventor: Hiroshi Tamura, Nagoya (JP)

(73) Assignee: Denso Corporation, Kariya (JP)

( * ) Notice: Subject to any disclaimer, the term of this patent is extended or adjusted under 35 U.S.C. 154(b) by 45 days.

(21) Appl. No.: 12/861,350

(22) Filed: Aug. 23, 2010

(65) Prior Publication Data

US 2011/0043393 A1 Feb. 24, 2011

(30) Foreign Application Priority Data

Aug. 21, 2009 (JP) ................................ 2009-192018

(51) Int. Cl.
*H03M 1/06* (2006.01)

(52) U.S. Cl. ........ 341/118; 341/119; 341/120; 341/121; 341/155; 341/115

(58) Field of Classification Search .......... 341/118–121, 341/155, 156, 172
See application file for complete search history.

(56) References Cited

U.S. PATENT DOCUMENTS

| | | | |
|---|---|---|---|
| 5,396,247 A | | 3/1995 | Watanabe et al. |
| 6,268,710 B1 * | | 7/2001 | Koga .......................... 320/116 |
| 6,336,063 B1 * | | 1/2002 | Lennevi ........................ 701/22 |
| 6,362,626 B2 * | | 3/2002 | Furukawa ..................... 324/429 |
| 6,549,014 B1 * | | 4/2003 | Kutkut et al. .................. 324/426 |
| 6,970,119 B2 * | | 11/2005 | Miyake et al. ................. 341/118 |
| 7,328,099 B2 * | | 2/2008 | Rees ............................. 701/113 |
| 7,864,090 B2 * | | 1/2011 | Yamamoto et al. ........... 341/119 |
| 7,880,432 B2 * | | 2/2011 | Yun et al. ....................... 320/116 |
| 7,889,105 B2 * | | 2/2011 | Zushi et al. ................... 341/120 |
| 7,900,081 B2 * | | 3/2011 | Kobayashi et al. ........... 713/600 |
| 2004/0177102 A1 | | 9/2004 | Nakamura et al. |
| 2008/0174450 A1 * | | 7/2008 | Tanizawa ................... 340/870.2 |
| 2009/0167575 A1 * | | 7/2009 | Mitani et al. ................. 341/118 |
| 2009/0251103 A1 | | 10/2009 | Yamamoto et al. |
| 2010/0149007 A1 * | | 6/2010 | Zushi et al. ................... 341/120 |

FOREIGN PATENT DOCUMENTS

| | | |
|---|---|---|
| JP | A-5-259907 | 10/1993 |
| JP | A-2000-101523 | 4/2000 |
| JP | A-2000-244324 | 9/2000 |
| JP | A-2004-274157 | 9/2004 |
| JP | A-2009-268068 | 11/2009 |

* cited by examiner

*Primary Examiner* — Linh Nguyen
(74) *Attorney, Agent, or Firm* — Oliff & Berridge, PLC (57) ABSTRACT

An analog to digital converting device has a first converter nonlinearly converting an analog level into a first digital value every first sampling period, shorter than a second sampling period, with low precision, a second converter linearly converting the analog level into a second digital value every second sampling period with high precision, and a controller determining a correction equation by using the second digital value having a high precision in each second sampling period so as to renew the equation every second sampling period, and correcting the first digital values, obtained in each second sampling period, to corrected digital values according to the corresponding correction equation to output the corrected digital value as a digital value, obtained by substantially linearly converting the analog level, every first sampling period.

12 Claims, 9 Drawing Sheets

DEVICE FOR CONVERTING ANALOG SIGNAL INTO DIGITAL VALUES AND CORRECTING THE VALUES

CROSS-REFERENCE TO RELATED APPLICATION

This application is based upon and claims the benefit of priority of the prior Japanese Patent Application 2009-192018 filed on Aug. 21, 2009, so that the contents of which are incorporated herein by reference.

BACKGROUND OF THE INVENTION

1. Field of the Invention

The present invention relates to an analog to digital converting device which converts the level of an arbitrary analog signal into a digital value every short sampling period of time and corrects the digital values to corrected values indicating the analog levels with high precision.

2. Description of Related Art

As an analog to digital (A/D) converter for converting the level of an arbitrary analog signal into a digital value every predetermined sampling period of time, generally-used A/D converters such as a $\Delta\Sigma$ type A/D converter, a successive approximation type A/D converter, a cyclic A/D converter and the like are well known. Recently, time A/D (TAD) converters have come to public notice. The sampling period of time in the TAD converters can be set to be shorter than that in the generally-used A/D converters. This TAD converter is, for example, disclosed in Published Japanese Patent First Publication No. 2004-274157.

For example, an accumulator battery (especially, a lithium ion battery) is mounted on a vehicle as a driving power source, and an A/D converter is used to detect the voltage of the accumulator battery from an analog signal indicating the battery voltage every sampling period of time. In this voltage detection, it is required to control each of the battery voltage and the remaining electric power of the battery within a proper range for the purpose of suppressing the deterioration of the battery. Because the battery voltage is greatly changed in a short time (e.g., in the order of millisecond), it is required to detect the battery voltage every shortened sampling period of time. Therefore, the TAD converter is useful to detect the battery voltage every shortened sampling period of time.

The TAD converter comprises a pulse delay circuit having a plurality of inverters connected with one another in a ring shape. The inverters receive the same analog signal set at a changeable input level to use the signal as the driving power of the inverters. The delay time of the inverters depends on the level of the signal. When a start pulse is inputted to the TAD converter, the pulse cyclically runs through the inverters while being delayed by the delay time in each inverter. The number of inverters, through which the pulse runs in a predetermined period of time, is detected. This number depends on the level of the signal. Therefore, when the pulse is inputted to the TAD converter every sampling period of time, the level of the signal is converted into a digital value corresponding to the detected number in an analog to digital converting characteristic every sampling period.

Although the generally-used converters have a linear analog to digital converting characteristic so as to linearly convert signal levels into digital values, the TAD converter has a nonlinear analog to digital converting characteristic so as to nonlinearly convert signal levels into digital values. Further, the TAD converter has a high temperature dependency, so that the digital value outputted from the TAD converter is largely varied with the atmospheric temperature. Therefore, the precision of digital values obtained in the TAD converter is lower than the precision of digital values obtained in the generally-used converters. To compensate for this low precision, in the Publication No. 2004-274157, each of a plurality of master reference voltages set at known levels is applied to the TAD converter to obtain a reference digital value, a correction equation is determined from the reference digital values such that corrected digital values, obtained by correcting the reference digital values according to the correction equation, linearly relate to the master reference voltages, and each digital value outputted from the TAD converter in response to the input level is corrected according to the correction equation. Therefore, the corrected digital values linearly depend on the input levels.

However, to determine the correction equation such that the corrected digital values linearly depend on the input levels, a plurality of circuits are inevitably required to apply the plurality of master reference voltages to the TAD converter. Therefore, the cost in the manufacturing of the TAD converter is considerably increased.

Further, the correction equation determined from a plurality of reference digital values is inevitably expressed by a polynomial. Therefore, an arithmetic circuit is inevitably complicated to correct digital values of the TAD converter according to the correction equation. Therefore, the size of the arithmetic circuit becomes large, so that the manufacturing cost is further increased.

These problems have generally occurred in A/D converters having a nonlinear analog to digital converting characteristic and A/D converters having high temperature dependency. In other words, these problems have occurred in any A/D converter which requires a plurality of master reference voltages to improve the precision lower than the precision in the generally-used A/D converters.

SUMMARY OF THE INVENTION

An object of the present invention is to provide, with due consideration to the drawbacks of the conventional A/D converter, an analog to digital converting device which converts an analog level of a signal into a digital value every shortened sampling period while simplifying a correction equation for correcting the digital values to corrected digital values indicating the analog levels with a high precision.

According to an aspect of this invention, the object is achieved by the provision of an analog to digital converting device comprising a first analog to digital converter, a second analog to digital converter, a correction equation determining unit and a correcting unit. The first analog to digital converter can convert an analog level of an input signal into a first digital value every first sampling period of time shorter than a second sampling period of time. The second analog to digital converter can convert the analog level of the input signal into a second digital value every second sampling period such that the second digital value indicates the analog level with a precision higher than a precision of the first digital value indicating the analog level. The correction equation determining unit determines a correction equation by using the second digital value each time the second digital value is obtained in the second analog to digital converter. The correcting unit corrects each of the first digital values, obtained in the first analog to digital converter in one second sampling period, to a corrected digital value according to the correction equation, determined by the correction equation determining unit by using the second digital value obtained in the second sampling period, every second sampling period and outputs the corrected digital values as digital values determined from the input signal.

With this structure of the converting device, the first analog to digital converter outputs the first digital values with a comparatively low precision and at a high processing speed, while the second analog to digital converter outputs the second digital values with a high precision and at a low processing speed. Each time the second digital value indicating the analog level of the input signal with a high precision is obtained in the second analog to digital converter, the correction equation determining unit determines the correction equation by using the second digital value. Therefore, this correction equation is renewed every second sampling period.

For example, the correction equation is determined such that, when the first and second analog to digital converters receiving the same analog level of the input signal outputs one first digital value and one second digital value, the correcting unit corrects this first digital value to a corrected digital value, equal to this second digital value, according to the correction equation.

Further, although the analog level of the input signal is changeable with time, a change in the analog level of the input signal is small in each second sampling period. Therefore, a difference of the first digital values obtained in each second sampling period is small. Although atmospheric temperature changes with time, the temperature is substantially constant in each second sampling period. Therefore, even when each first digital value outputted from the first analog to digital converter has a temperature dependency, a difference of the first digital values obtained in each second sampling period is still small.

Because the converting device obtains one first digital value, from which one corrected digital value is obtained, every first sampling period shorter than the second sampling period, the converting device can output one corrected digital value every shortened sampling period.

Further, in the prior art, a circuit for generating master reference voltages is required to determine a correction equation. However, in the present invention, the second digital value obtained with high precision is used for the determination of the correction equation and is renewed every second sampling period. Therefore, the converting device can determine the correction equation without any circuit for generating master reference voltages, or the converting device can determine the correction equation while downsizing a circuit for generating a master reference voltage.

Moreover, because the correction equation is determined by using the second digital value determined with a high precision while being renewed every second sampling period, the converting device can correct the first digital values, obtained in each second sampling period, according to the correction equation, determined in the second sampling period, with a high precision.

Furthermore, because of a small change in the analog level of the input signal and a stable temperature in each second sampling period, the term corresponding to the atmospheric temperature and the term corresponding to a change in the input signal can be removed from the correction equation. Accordingly, the correction equation can be simplified, and an arithmetic circuit for calculating each corrected digital value according to the correction equation can be downsized. In this case, the converting device can be manufactured in a small size.

For example, the correction equation can be expressed by a linear function. In this case, an inclination and an intercept of the linear function can be determined by using a single master reference voltage.

DETAILED DESCRIPTION OF THE PREFERRED EMBODIMENTS

An embodiment of the present invention will now be described with reference to the accompanying drawings, in which like reference numerals indicate like parts, members or elements throughout the specification unless otherwise indicated.

Embodiment

Figure 1:
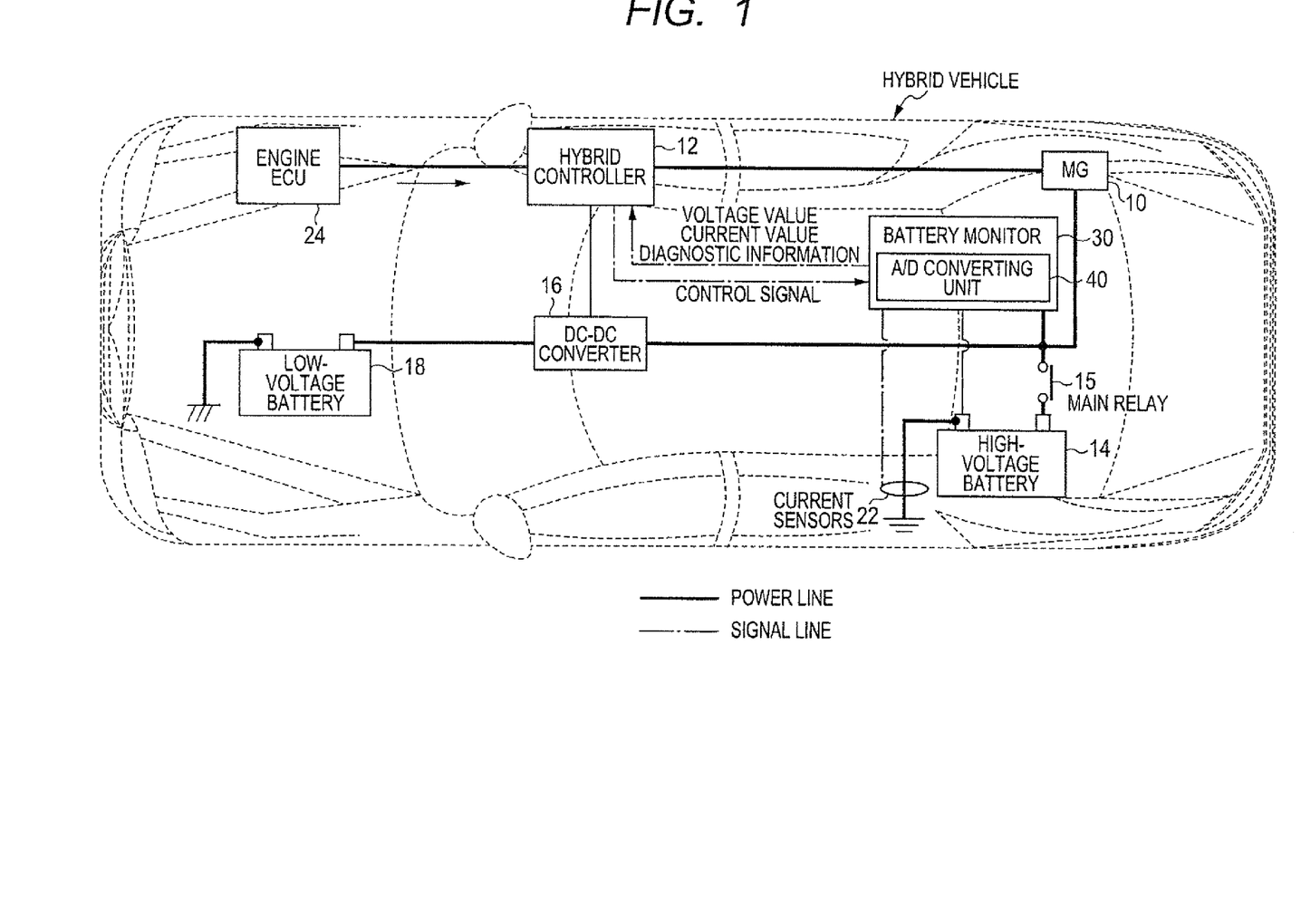
FIG. 1 is a view showing the structure of a driving system of a vehicle having an analog to digital converting device according to the first embodiment of the present invention.

FIG. 1 is a view showing the structure of a driving system of a vehicle having an analog to digital converting device according to the first embodiment. As shown in FIG. 1, a driving system of a vehicle has a motor generator (MG) 10 for generating a torque as the driving force of the vehicle, an engine electronic control unit (ECU) 24 for controlling an internal combustion engine (not shown) of the vehicle, a hybrid controller 12 for controlling the torque of the generator 10 under control of the engine ECU 24 by controlling a power changing circuit (i.e., inverters) connected with the controller 12 and the generator 10, a high-voltage battery 14 used as a power source of the generator 10, a low-voltage battery 18, a DC-DC converter 16 for stepping down the direct current voltage of the battery 14 to a low direct current voltage and applying this low direct current voltage to the battery 18 under control of the controller 12, a main relay 15 for connecting the generator 10 and the converter 16 with the battery 14, current sensors 22 for detecting an inflow current flowing from the generator 10 to the battery 14 and outflow currents flowing from the battery 14 to the generator 10 and the converter 16, and a battery monitor 30.

The monitor 30 monitors the state of charge in the battery 14 by receiving the currents detected in the sensors 22 and the voltage of the battery 14. The state of charge indicates the remaining charge of the battery 14. The state of charge is a physical quantity of the discharging ability of the battery 14. In other words, the state of charge denotes the ratio of the current charged quantity to the full charged quantity.

Figure 2:
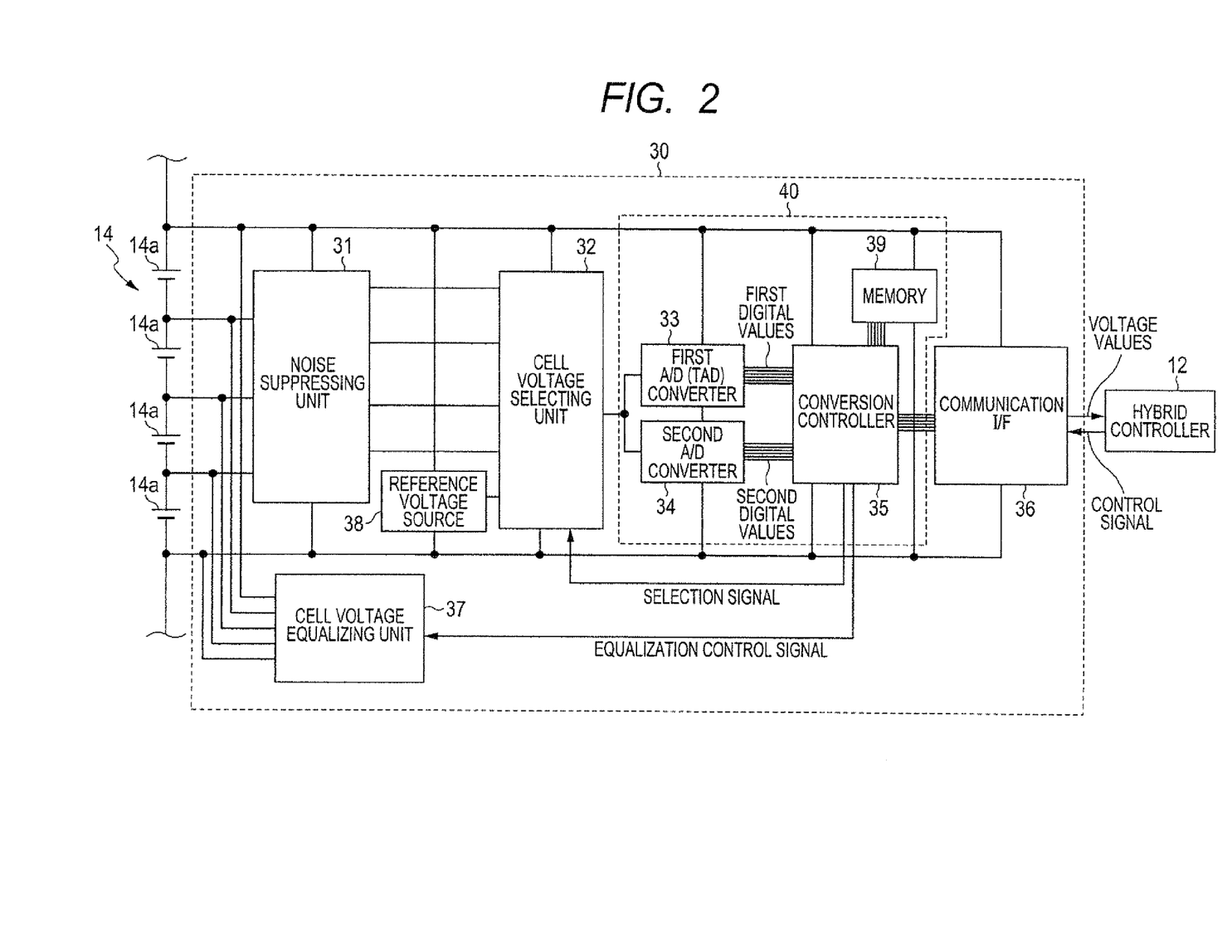
FIG. 2 is a view showing the structure of a battery monitoring apparatus with the converting device shown in FIG. 1.

FIG. 2 is a view showing the structure of the monitor 30 and the battery 14.

As shown in FIG. 2, the battery 14 is a battery pack having a plurality of battery cells 14a serially connected with one another as a serial connector. Each cell 14a is formed of a lithium ion secondary battery. The monitor 30 has a function for detecting the voltage of each cell 14a and a function for equalizing the voltages of the cells 14a with one another on the basis of the detected voltages to equalize quantities of the remaining electric charge in the cells 14a with one another.

The monitor 30 has a noise suppressing unit 31 for suppressing noise superimposed onto a signal indicating the voltage of each cell 14a, a single reference voltage source 38 for outputting a master reference voltage Vref (e.g., 3.000V), a cell voltage selecting unit 32 for selecting signals indicating the noise suppressed voltages of the cells 14a one after another or selecting a signal indicating the reference voltage Vref of the source 38, an analog to digital (A/D) converting unit (i.e., an A/D converting device) 40 for converting the analog level of the noise suppressed signal selected in the unit 32 into a digital value every shortened sampling period of time and correcting the digital values into corrected values such that the corrected values precisely indicate the analog levels of the selected signal, a communication interface (I/F) 36 through which each digital value of the cell voltage is outputted to the controller 12, and a cell voltage equalizing unit 37 for specifying one or more cells 14a having terminal voltages higher than a predetermined value on the basis of the digital values of the cell voltages and discharging electric power from the specified cells 14a to set quantities of the remaining charge in the specified cells 14a within a proper charge range and to equalize the voltages of the cells 14a with one another.

The voltage detecting function of the monitor 30 will be described in brief. The selecting unit 32 receives signals indicating the voltages of the cells 14a through the noise suppressing unit 31, repeatedly selects one of the voltage signals under control of the converting unit 40 so as to select the voltage signals of the cells 14a one by one, and outputs the voltage signal of one cell 14a every signal selection. The converting unit 40 converts the analog level of the selected signal into a digital value every sampling period.

Figure 3:
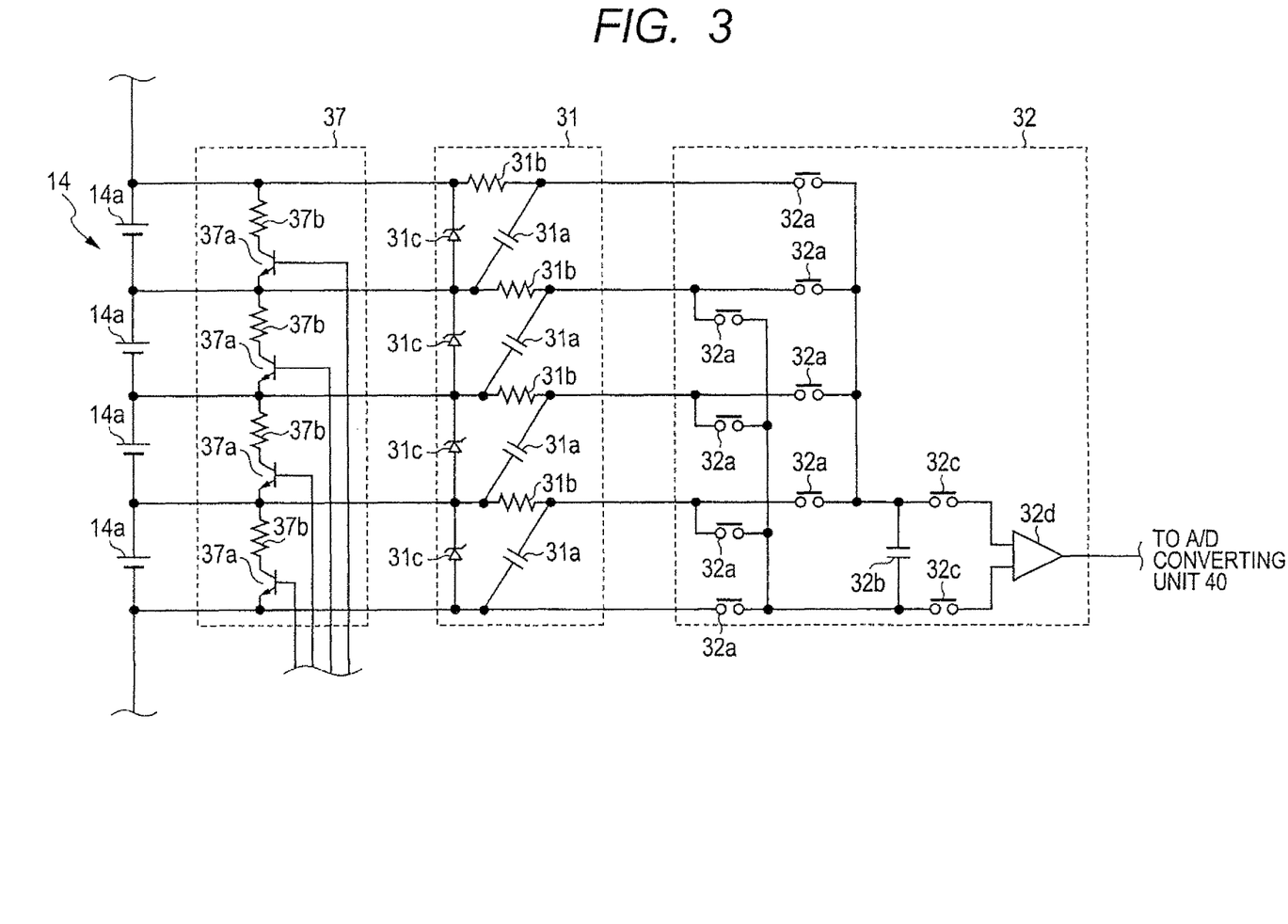
FIG. 3 is a view showing the structure of a noise suppressing unit, a cell voltage selecting unit and a cell voltage equalizing unit shown in FIG. 2.

FIG. 3 is a view showing the structure of the noise suppressing unit 31, the cell voltage selecting unit 32 and the cell voltage equalizing unit 37.

As shown in FIG. 3, the unit 31 has a capacitor 31a, a resister 31b and a zener diode 31c connected with one another for each cell 14a. The capacitor 31a and the resister 31b corresponding to each cell 14a acts as a filtering circuit for suppressing noise superimposed onto the waveform of the voltage signal outputted from the cell 14a. The zener diode 31c corresponding to each cell 14a acts as a protecting circuit for protecting electronic parts from the serge voltage occurred in the cell 14a.

The unit 32 has a plurality of selecting switches 32a, a capacitor 32b, two output switches 32c and a comparator 32d. The switches 32a and 32b are operated under control of the converting unit 40. The switches 32a are turned on and off while the switches 32c are set in the off state, and positive and negative electrodes of one cell 14a selected in the unit 32 are electrically connected with terminals of the capacitor 32b to accumulate charges corresponding to the voltage of the cell 14a in the capacitor 32b. Then, the switches 32a are set in the off state, and the switches 32c are turned on. Therefore, the charges of the capacitor 32b are supplied to the comparator 32d, and a signal indicating the voltage of the cell 14a is outputted from the capacitor 32b to the converting unit 40.

Returning to FIG. 2, the converting unit 40 has a first A/D converter (i.e., a TAD converter) 33 for performing the A/D conversion every first sampling period with comparatively low precision, a second A/D converter 34 for performing the A/D conversion every second sampling period longer than the first sampling period with high precision, and a conversion controller 35 for controlling the conversion of the converters 33 and 34. The converters 33 and 34 are connected in parallel to each other. Each of the converters 33 and 34 converts the analog level of the voltage signal of one cell 14a selected in the unit 32 into a digital value. The controller 35 calculates the terminal voltage of the selected cell 14a from the digital values of the converters 33 and 34 and outputs the voltage of the cell 14a to the controller 12 through the interface 36. Therefore, the monitor 30 can detect the voltage of the cell 14a to send the digital voltage value to the controller 12.

Further, each time the controller 35 calculates the voltage of one cell 14a, the controller 35 produces a plurality of selection signals and outputs these signals to the switches 32a and 32b of the selecting unit 32, and the selecting unit 32 selects another cell 14a. Therefore, the selecting unit 32 can select the voltages of the cells 14a one after another, and the converting unit 40 can calculate the digital voltage values of the cells 14a one after another. For example, the selecting unit 32 selects all cells 14a every first sampling period, and the TAD converter 33 converts the voltages signals of the cells 14a every first sampling period. Alternatively, the cells 14a are partitioned into a plurality of groups each of which has ten cells 14a, the selecting unit 32 and the TAD converter 33 are prepared for each group of cells 14a, each TAD converter 33 converts the voltages signals of the corresponding group of cells 14a selected in the corresponding selecting unit 32 every first sampling period, and the controller 35 receives the digital values from the TAD converters 33 every first sampling period.

The cell voltage equalizing function of the monitor 30 will be described in brief. The controller 35 calculates the difference between the remaining charge quantity of each cell 14a and a reference charge quantity on the basis of the calculated voltage of the cell 14a and produces an equalization control signal corresponding to the cell 14a when the remaining charge quantity is larger than the reference charge quantity. This signal indicates a quantity of electric charge to be discharged from the cell 14a. When the cell 14a discharges the remaining charge by this quantity, the remaining charge of the cell 14a is placed within a proper range. As shown in FIG. 3, the equalizing unit 37 has a switch 37a and a resistor 37b for each cell 14a. The switch 37a corresponding to each cell 14a is turned on in response to the corresponding equalization control signal, and the electric charge of the cell 14a is discharged in the corresponding resistor 37b by a quantity indicated by the signal during the on state of the switch 37a. Therefore, when the equalizing unit 37 receives the equalization control signals from the controller 35, the cells 14 corresponding to the signals discharge electric charge, and the equalizing unit 37 substantially equalizes the remaining charge quantities of the cells 14 with one another.

The reason that the equalizing operation of the equalizing unit 37 is required will be described. It is assumed that no equalizing operation is performed for the cells 14 having the remaining charge quantities largely different from one another. When the charging operation is performed for the battery 14, the charge quantities of the cells 14 still largely differ from one another. In this case, cells 14 having higher remaining charge quantities before this charging operation have excessive remaining charge quantities after the charging operation. The excessive remaining charge quantities exceed the upper limit allowed for the cells 14a. In contrast, cells 14 having lower remaining charge quantities before this charging operation have insufficient remaining charge quantities after the charging operation. The insufficient remaining charge quantities are largely lower than the upper limit. Therefore, deterioration of the battery 14 is promoted. Further, when the discharging operation is performed for the battery 14 to drive the vehicle, the charge quantities of the cells 14 still largely differ from one another. In this case, cells 14 having lower remaining charge quantities before this discharging operation are set in the over-discharge state, while cells 14 having higher remaining charge quantities before this charging operation have remaining charge quantities higher than the lower limit allowed for the cells 14a. Therefore, deterioration of the battery 14 is also promoted.

To prevent the deterioration of the battery 14, in this embodiment, the voltage of each cell 14a is detected in the converting unit 40, and the electric charge of the cells 14a is discharged by the equalizing unit 37 on the basis of the detected voltages of the cells 14a so as to equalize the voltages of the cells 14a. Accordingly, the deterioration of the battery 14 based on the differences among the voltages of the cells 14a can be prevented.

Further, because the cell voltages of the battery 14 are largely changed in a short time (e.g., in the order of millisecond), it is required to detect each cell voltage every shortened sampling period of time (e.g., a period of time equal to or shorter than one millisecond). Moreover, to equalize the cell voltages with high precision, it is required to detect the cell voltages with high precision (in other words, in high resolution).

To perform the analog to digital conversion every shortened sampling period with high precision in the converting unit 40, the first A/D converter 33 is formed of a time A/D (TAD) converter, while the second A/D converter 34 is formed of a generally-used A/D converter such as a ΔΣ type A/D converter. The TAD converter 33 converts each cell voltage selected in the selecting unit 32 into a first digital value every first sampling period (e.g. every period shorter than one millisecond). Each first digital value indicates the corresponding cell voltage with comparatively low precision. In other words, the linearity in the conversion of the TAD converter 33 is comparatively low. The second converter 34 converts each cell voltage selected in the selecting unit 32 into a second digital value every second sampling period (e.g., every period equal to or longer than one millisecond) longer than the first sampling period. Each second digital value indicates the corresponding cell voltage with high precision. In other words, the linearity in the conversion of the second converter 34 is high. The controller 35 corrects the first digital values having the comparatively low precision on the basis of the second digital value, recently obtained with high precision, every second sampling period. Accordingly, the converting unit 40 can convert each cell voltage into the corrected digital value every shortened sampling period with high precision.

The structure of the converting unit 40 will be described in detail.

As shown in FIG. 2, the converters 33 and 34 connected in parallel to each other receive an analog signal, indicating the cell voltage, from the selecting unit 32 at the same timing. The second sampling period Ts2 is, for example, set to be equal to the product of the first sampling period Ts1 and an integral value N equal to or higher than two (i.e., Ts2=Ts1×N, N≧2). Therefore, each time one second digital value is obtained in the second converter 34, one first digital value is obtained in the TAD converter 33 at the same timing as the timing of the second digital value.

Further, although the analog to digital conversion characteristic in the second converter 34 is substantially linear, the analog to digital conversion characteristic in the TAD converter 33 is nonlinear. To precisely indicate levels of the signal by outputs of a converter, it is required that the outputs have the linear relation with the levels. Therefore, it is required to correct the first digital values of the TAD converter 33 such that corrected digital values have the linear relation with levels of the signal.

Moreover, each of the converters 33 and 34 has a temperature dependency, so that the analog to digital conversion characteristic in each converter changes with the temperature of the atmosphere surrounding the converter. The temperature dependency of the TAD converter 33 is higher than the temperature dependency of the second converter 34. Therefore, the controller 35 corrects the first digital values by using the analog to digital conversion characteristic of the TAD converter 33 at the present atmospheric temperature.

The converting unit 40 has a memory 39 such as a non-volatile memory for storing various maps. The controller 35 corrects the first digital values by using these maps.

Furthermore, the precision of the second digital value obtained in the second converter 34 every second sampling period is higher than the precision of the first digital value obtained in the TAD converter 33 every first sampling period. Therefore, the second digital values can be determined in a resolution higher than a resolution of the first digital values.

Figure 4:
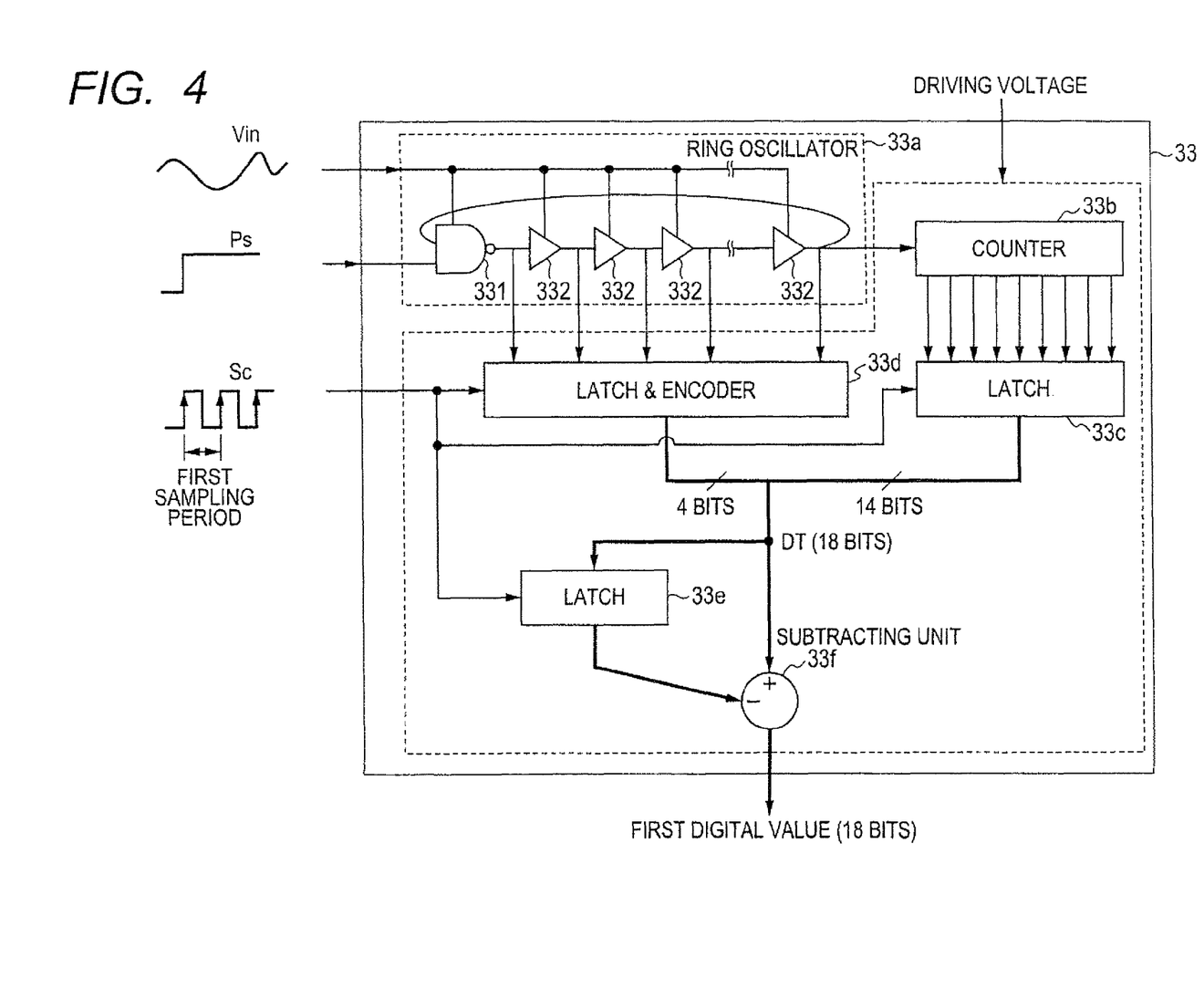
FIG. 4 is a view showing the structure of a TAD converter used as a first analog to digital converter of the converting device shown in FIG. 2.

FIG. 4 is a view showing the structure of the TAD converter 33. As shown in FIG. 4, the TAD converter 33 has a ring oscillator 33a acting as a voltage control oscillator. The oscillator 33a is composed of an odd number of delay elements, having negative gains, connected with one another in a ring shape. For example, the oscillator 33a has an NAND circuit 331 and an even number of logic inverting circuits (i.e., inverters) 332. The inverters 332 are serially connected with one another, one open terminal of the series of inverters 332 is connected with the output terminal of the NAND circuit 331, and the other open terminal (i.e., the output terminal of the oscillator 33a) of the series of inverters 332 is connected with one input terminal of the NAND circuit 331. The delay elements (the NAND circuit 331 and the inverters 332) receive the same cell voltage (hereinafter, called an input voltage Vin changeable with time), selected in the selecting unit 32, as the driving power of the delay elements 331 and 332. The delay time of each delay element changes with the input voltage Vin.

A start pulse signal Ps having a leading edge is applied to the other input terminal of the NAND circuit 331 as a trigger signal for oscillating the oscillator 33a. Therefore, each time the signal Ps passes through the oscillator 33a while being delayed in each delay element 331 or 332, the logic (i.e., polarity) of the output terminal of the oscillator 33a is inverted. Further, the logic of the output terminal of each delay element 331 or 332 is inverted when the signal Ps passes through the delay element 331 or 332 while being delayed in the delay element.

The TAD converter 33 further has a counter 33b incrementing a counted value each time the logic at the output terminal of the oscillator 33a is inverted, a latch 33c latching the counted value of the counter 33b in synchronization with each leading edge of a sampling clock signal Sc, and a latch & encoder 33d latching the output levels of the delay elements 331 and 332 of the oscillator 33a in synchronization with each leading edge of the signal Sc. The digital counted value of the counter 33b denotes the number of logic inversions repeated at the output terminal of the oscillator 33a. Therefore, this digital counted value indicates how many times the signal Ps is circulated through the oscillator 33a. The signal Sc has one leading edge every first sampling period. The latch 33c outputs the counted value, incremented during a period from the input time of the signal Ps to the time of one leading edge of the signal Sc, every leading edge of the signal Sc. The signal Ps arrives at one delay element 331 or 332 of the oscillator 33a each time the encoder 33d receives one leading edge of the signal Sc. The encoder 33d detects the number of delay elements ranging from the NAND circuit 331 to the delay element 332 at which the signal Ps arrives, and outputs an encoded value, indicating the detected number of delay elements, every leading edge of the signal Sc.

A combined digital value DT is obtained from the encoded value of the encoder 33d and the counted value of the latch 33c. This value DT is obtained by placing bits indicating the encoded value of the encoder 33d at lower positions of the value DT and placing bits indicating the counted value of the latch 33c at higher positions of the value DT. Therefore, the combined digital value DT indicates the number of delay elements 331 and 332 through which the signal Ps passes during a period from the input time of the signal Ps to the time of the current edge of the signal Sc.

The TAD converter 33 further has a latch 33e for latching the combined digital value DT and holding this value DT for one first sampling period, and a subtracting unit 33f for subtracting the combined digital value DT of the previous sampling period held in the latch 33e from the combined digital value DT, obtained from the encoded value and the counted value just outputted from the encoder 33d and the encoder 33d, and outputting the subtracted value as a first digital value obtained in the current first sampling period. The first digital value indicates the number of delay elements 331 and 332 through which the signal Ps passes during one first sampling period between the preceding and current edges of the signal Sc.

As described before, the delay time of each delay element 331 or 332 depends on the input voltage Vin, and the number of delay elements 331 and 332, through which the signal Ps passes while being delayed in each of the delay elements during one first sampling period, depends on the delay time of each delay element 331 or 332. Therefore, the first digital value outputted from the TAD converter 33 depends on (i.e., corresponds to) the input voltage Vin.

The first digital value indicating the number Np of passing delay elements 331 and 332 expresses the analog input voltage Vin with the precision indicated by the reciprocal number 1/Np of the passing delay element number Np. Because the first sampling period is set to be shorter than the second sampling period, the number Np of passing delay elements becomes small. Therefore, the precision of the first digital value becomes worse.

Further, because the delay time of each delay element 331 or 332 is not linearly changed with the input voltage Vin, the first digital value expressing the input voltage Vin has a non-linear relation with the input voltage Vin. This non-linearity changes with the atmospheric temperature and with a high temperature dependency. Additionally, when many converting units 40 are produced in mass production, the analog to digital converting characteristic of one converting unit 40 differs from the analog to digital converting characteristic of another converting unit 40. Therefore, to express the input voltage Vin by a digital value, having the linear relation with the input voltage Vin, with high precision, it is required to correct the first digital values outputted from the TAD converter 33.

The ΔΣ type A/D converter adopted as the second converter 34 is, for example, disclosed in Published Japanese Patent First Publications Nos. 2000-101523 and 2000-244324. In this disclosed ΔΣ type A/D converter, as is well known, a digital value obtained at a time preceding to the current time by one sampling period is converted into an analog value, the difference between the analog input voltage and the converted analog value is integrated, and the obtained integrated result is compared with a reference level to obtain a compared result as a digital value obtained at the current time. Therefore, the level of the analog input signal is converted into the digital value every sampling period.

The controller 35 receives the first digital value, obtained from the analog input voltage Vin in the TAD converter 33, every first sampling period Ts1 and receives the second digital value, obtained from the analog input voltage Vin in the second converter 34, every second sampling period Ts2 (=Ts1×N, N is an integral value). The precision of the second digital values in the conversion of the second converter 34 is high, while the precision of the first digital values in the conversion of the TAD converter 33 is low.

The correction of the first digital values in the controller 35 will be described in detail.

Figure 5:
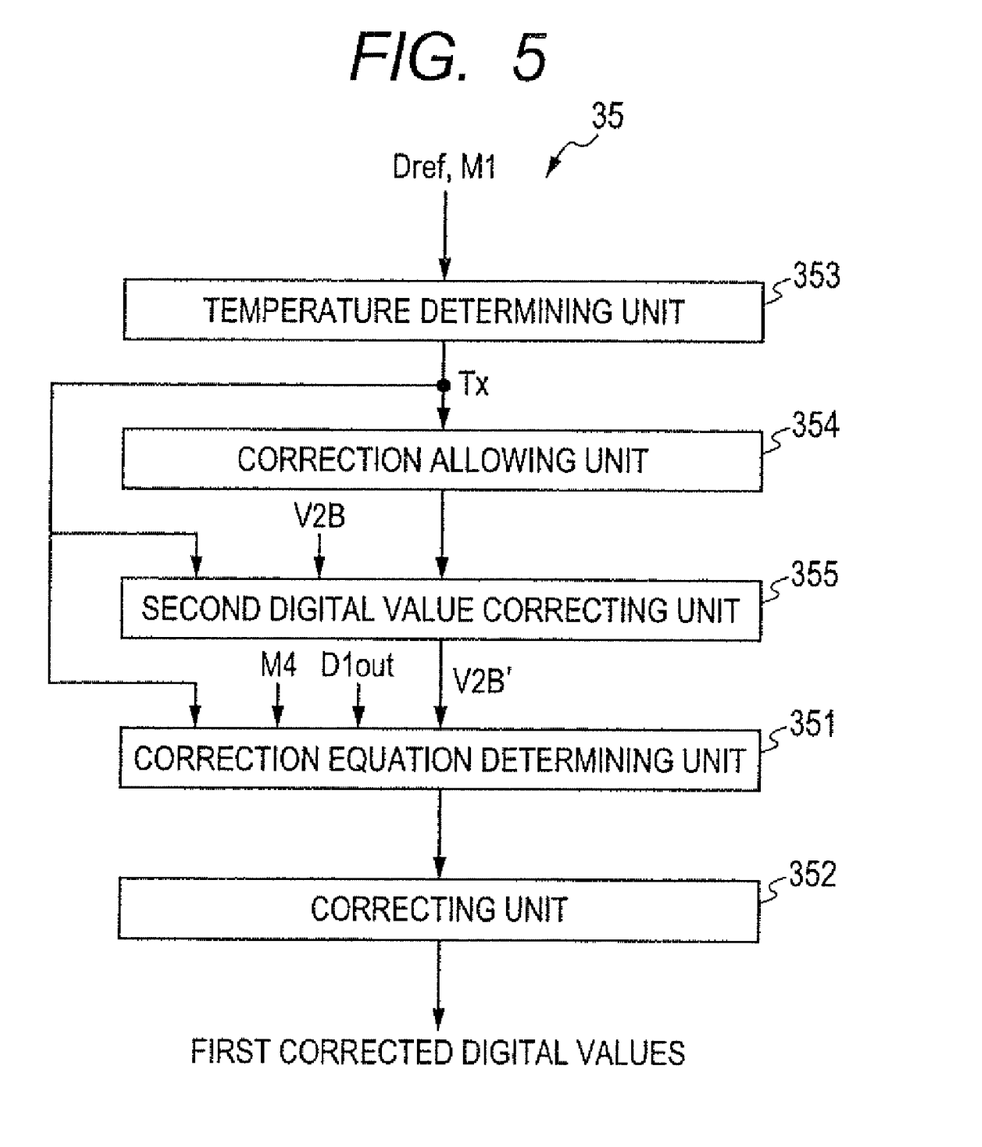
FIG. 5 is a block diagram of a conversion controller shown in FIG. 2.

FIG. 5 is a block diagram of the controller 35. As shown in FIG. 5, the controller 35 has a correction equation determining unit 351 for determining a correction equation by using one second digital value each time the second digital value is obtained in the second converter 34, and a correcting unit 352 for correcting each of the first digital values, obtained in the TAD converter 33 in one second sampling period, to a first corrected digital value according to the correction equation, determined by using the second digital value obtained in the second sampling period, every second sampling period and outputting the corrected digital values as digital values determined from the voltage signal of the selected cell 14a.

Each time the controller 35 receives one second digital value obtained in the second converter 34 at the start time of one second sampling period, the correcting unit 352 of the controller 35 corrects N first digital values, obtained in the TAD converter 33 in a period started at the start time of this second sampling period and ended at a time earlier than the start time of the succeeding second sampling period, while using the second digital value as a reference value. That is, although the correcting unit 352 receiving one second digital value at the start time of one second sampling period receives no second digital value before the succeeding second sampling period, the correcting unit 352 corrects N−1 first digital values, obtained before the succeeding second sampling period, by using the second digital value obtained at the start time of this second sampling period. In other words, each time the correcting unit 352 receives one first digital value obtained in the TAD converter 33, the correcting unit 352 corrects this first digital value by using the second digital value recently received in the correcting unit 352. Therefore, the correcting unit 352 corrects the first digital values one after another by using the second digital value recently received.

Figure 6:
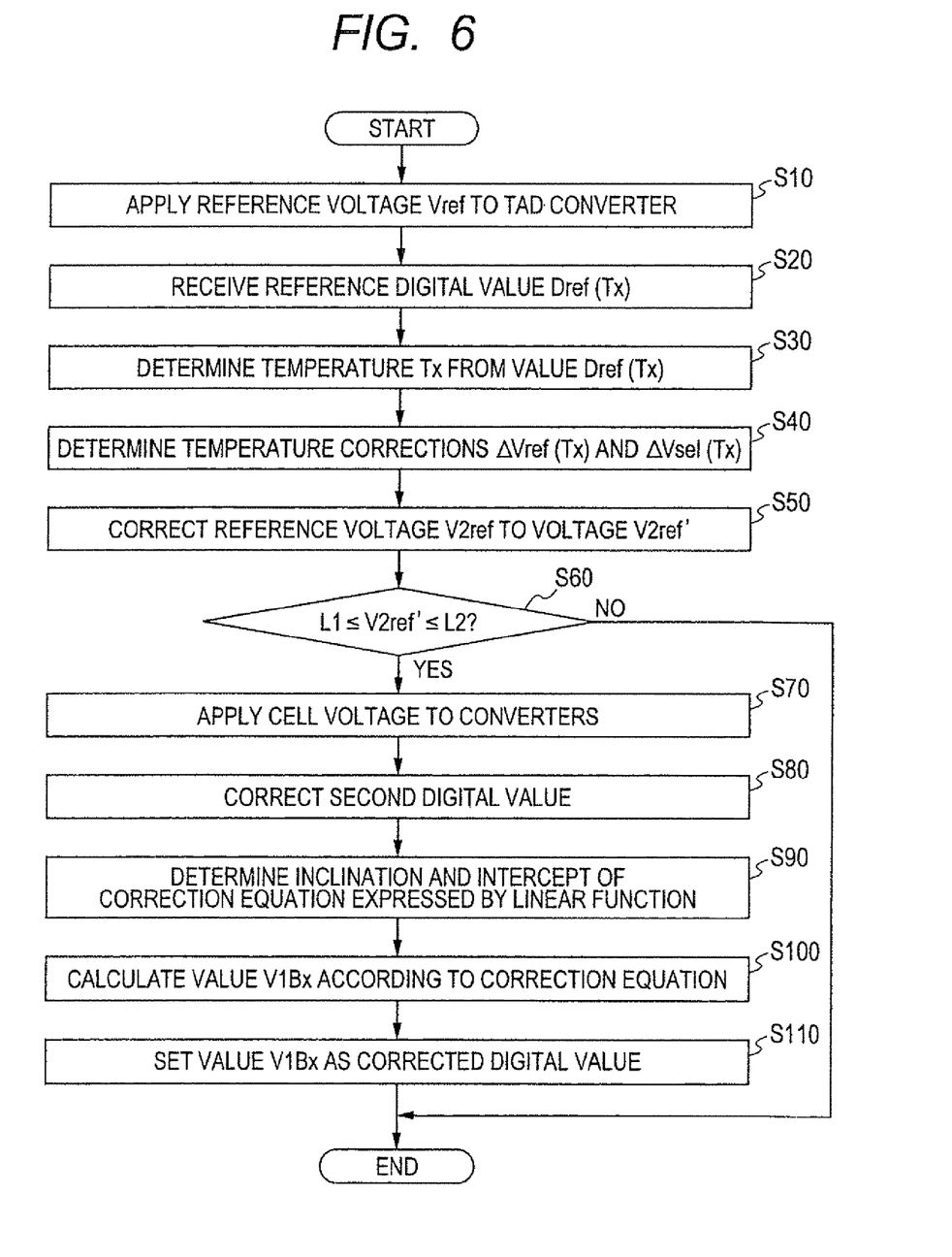
FIG. 6 is a flowchart of a process for correcting first digital values calculated in the first analog to digital converter shown in FIG. 4.

FIG. 6 is a flow chart of a process for correcting the first digital values of the TAD converter 33. This correcting process is performed every correcting period shorter than the second sampling period Ts2. Preferably, the correcting period be set to be equal to or shorter than the first sampling period Ts1.

In this correcting process, a temperature determining unit 353 (see FIG. 5) of the controller 35 determines the present value Tx of the atmospheric temperature T (hereinafter, called a present atmospheric temperature Tx) (steps S10 to S30), and the controller 35 judges whether or not the monitor 30 is normally operated (steps S40 to S60). In this judgment, the present atmospheric temperature Tx is considered. When the monitor 30 is normally operated, the controller 35 corrects one or more first digital values received in the present correcting period by using the second digital value recently received in the controller 35 while considering the present atmospheric temperature Tx (steps S70 to S110).

Because the temperature dependency of the first digital values in the TAD converter 33 is higher than the temperature dependency of the second digital value in the second converter 34, the TAD converter 33 is sensitive to the atmospheric temperature T more than the second converter 34. Further, the reference voltage Vref outputted from the reference voltage source 38 is set at a known level (e.g., 3.000V). Therefore, the TAD converter 33 and the source 38 are used to determine the present atmospheric temperature Tx. The TAD converter 33 converts the known reference voltage Vref of the source 38 into a first reference digital value Dref(Tx), and the controller 35 determines the present atmospheric temperature Tx from the reference digital value Dref(Tx).

Figure 7:
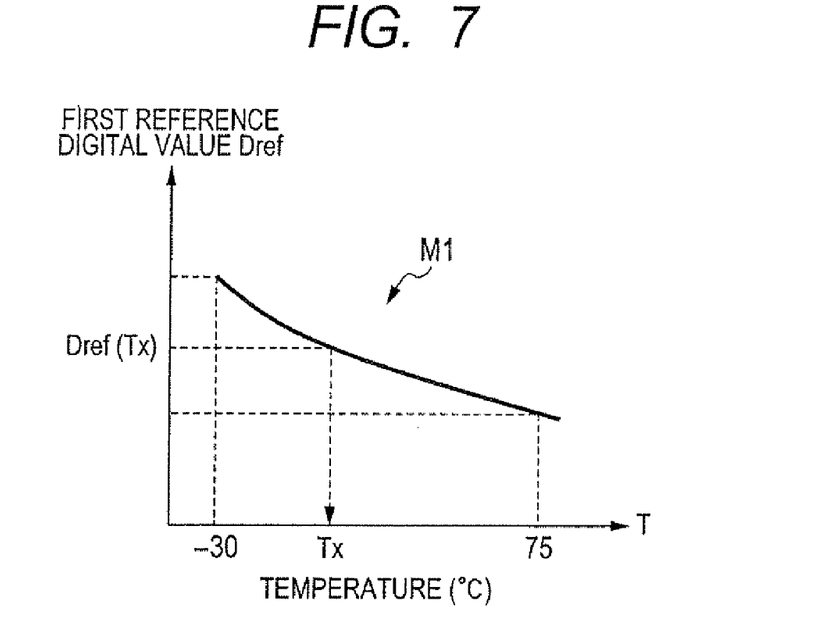
FIG. 7 is a view showing a first map used for the correction in the process shown in FIG. 6.

For example, at step S10, the controller 35 outputs a selection signal to the selecting unit 32 to select the reference voltage Vref of the source 38 and to apply the reference voltage Vref to the TAD converter 33. At step S20, the controller 35 receives the reference digital value Dref(Tx) from the TAD converter 33. At step S30, the temperature determining unit 353 of the controller 35 determines the present atmospheric temperature Tx from the digital value Dref(Tx) according to a first map M1. FIG. 7 is a view showing the first map M1. This map M1 indicates the characteristic of the first reference digital value Dref(T) with respect to the atmospheric temperature T. This map M1 is prepared in advance and is stored in the memory 39. Therefore, the controller 35 can determine the present atmospheric temperature Tx according to the first map M1.

To judge whether or not the monitor 30 is normally operated, the source 38 outputting the known reference voltage Vref and the second converter 34 superior in the precision are used, a second reference digital value is obtained from the known reference voltage Vref in the second converter 34 with high precision, and the controller 35 performs this judgment on the basis of the second reference digital value. In this case, the source 38 receives influence of the atmospheric temperature T, and the reference voltage Vref outputted from the source 38 is slightly changed with the atmospheric temperature T. Further, the selecting unit 32 receives influence of the atmospheric temperature T, and the reference voltage Vref selected in the selecting unit 32 is slightly changed with the atmospheric temperature T. Therefore, it is required to correct the reference voltage Vref on the basis of the present atmospheric temperature Tx.

Figure 8:
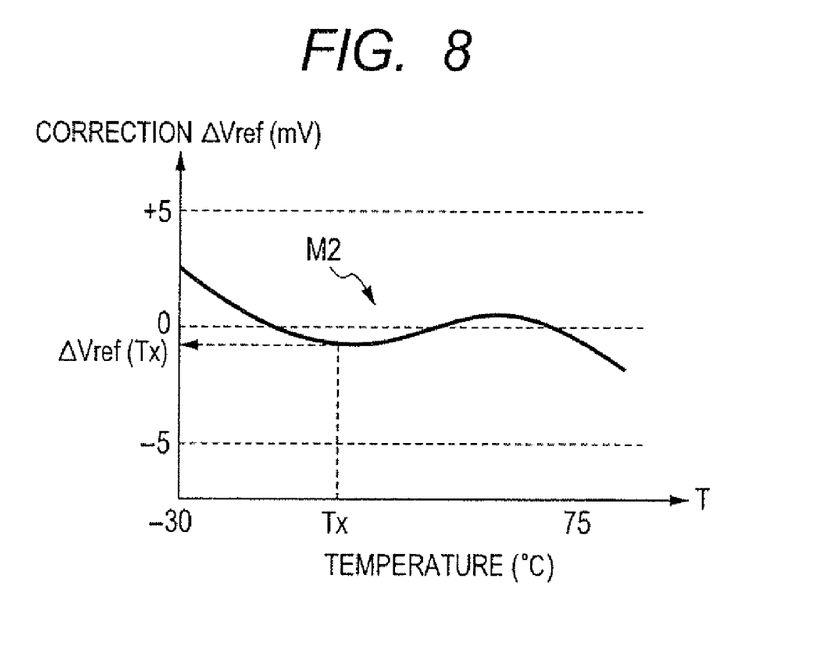
FIG. 8 is a view showing a second map used for the correction in the process shown in FIG. 6.
Figure 9:
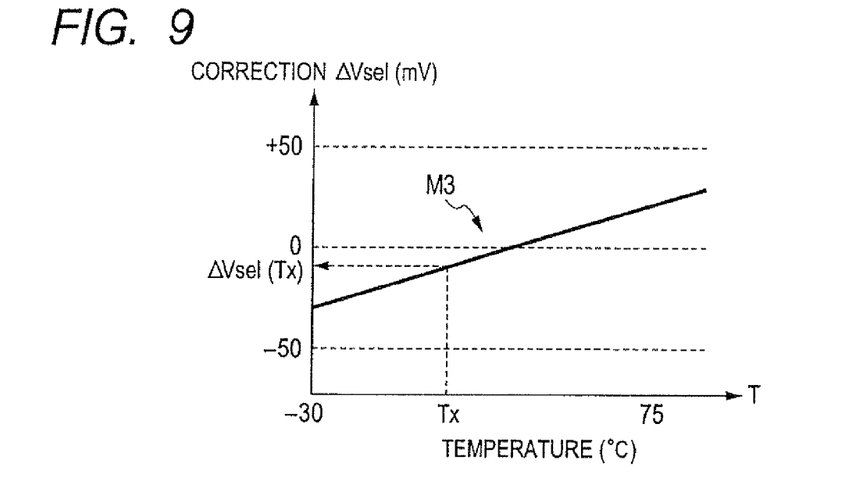
FIG. 9 is a view showing a third map used for the correction in the process shown in FIG. 6.

For example, at step S40, the controller 35 determines a temperature correction $\Delta Vref(Tx)$ of the reference voltage Vref based on the temperature dependency of the source 38 according to a second map M2. FIG. 8 is a view showing the second map M2. This map M2 indicates the characteristic of the temperature correction $\Delta Vref(T)$ with respect to the atmospheric temperature T. This map M2 is prepared in advance and is stored in the memory 39. Therefore, the temperature correction $\Delta Vref(Tx)$ can be determined according to the second map M2. Further, the controller 35 determines a temperature correction $\Delta Vsel(Tx)$ of the reference voltage Vref based on the temperature dependency of the selecting unit 32 according to a third map M3. FIG. 9 is a view showing the third map M3. This map M3 indicates the characteristic of the temperature correction $\Delta Vsel(T)$ with respect to the atmospheric temperature T. This map M3 is prepared in advance and is stored in the memory 39. Therefore, the temperature correction $\Delta Vsel(Tx)$ can be determined according to the third map M3.

At step S50, the second converter 34 converts the known reference voltage Vref of the source 38 into a second reference digital value. The controller 35 determines a second reference voltage V2ref corresponding to the second reference digital value and corrects the voltage V2ref by using the temperature correction $\Delta Vref(Tx)$ and the temperature correction $\Delta Vsel(Tx)$. More specifically, the controller 35 determines a corrected reference voltage V2ref' by adding the corrections $\Delta Vref(Tx)$ and $\Delta Vsel(Tx)$ to the voltage V2ref (V2ref'=V2ref+$\Delta Vref(Tx)$+$\Delta Vsel(Tx)$).

At step S60, a correction allowing unit 354 (see FIG. 5) of the controller 35 judges whether or not the corrected reference voltage V2ref' is placed between tolerance limits L1' and L2'. In the case of an affirmative judgment at step S60, the allowing unit 354 judges that the monitor 30 is normally operated. In contrast, in the case of a negative judgment at step S60, the allowing unit 354 judges that the monitor 30 is out of order or malfunctions, and the allowing unit 354 stops this process.

Figure 10:
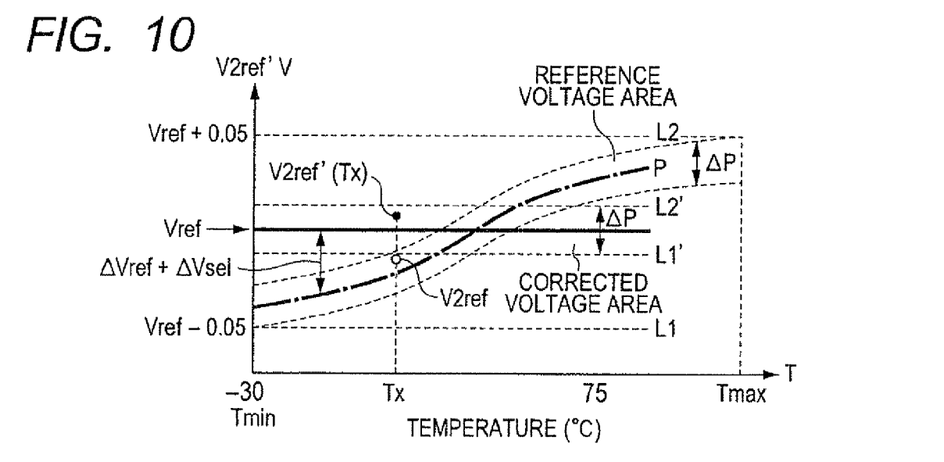
FIG. 10 is a view showing tolerance limits used for the correction in the process shown in FIG. 6.

FIG. 10 is a view showing tolerance limits L1' and L2' of the corrected reference voltage V2ref'. As shown in FIG. 10, because the reference voltage V2ref is changed with the atmospheric temperature T, the voltage V2ref is idealistically placed on a temperature characteristic line P in a temperature area ranging from the minimum temperature Tmin to the maximum temperature Tmax. However, the voltage V2ref is actually determined with a detection error ranged from +$\Delta P/2$ to −$\Delta P/2$ ($\Delta P>0$). Therefore, the voltage V2ref is actually placed within a reference voltage area centering the line P at the voltage width $\Delta P$. This voltage area has the lower limit L1 at the minimum temperature Tmin and has the upper limit L2 at the maximum temperature Tmax.

The difference between the nominal value Vref of the reference voltage and a voltage value on the line P is equal to the sum of the corrections $\Delta Vref$ and $\Delta Vsel$ at any temperature T. The corrected reference voltage V2ref' is placed within a corrected voltage area centering the nominal value Vref of the reference voltage at the voltage width $\Delta P$. This corrected voltage area has the lower limit L1' as a tolerance limit and has the upper voltage limit L2' as another tolerance limit.

Therefore, when the monitor 30 is operating normally, the corrected reference voltage V2ref' is placed between the tolerance limits L1' and L2'. The voltage width between the tolerance limits L1' and L2' is smaller than the voltage width between the voltage limits L1 and L2. Accordingly, because the reference voltage V2ref is corrected by the corrections $\Delta Vref(Tx)$ and $\Delta Vsel(Tx)$ to obtain the corrected reference voltage V2ref', the analog reference voltage Vref can be expressed by the digital reference voltage V2ref' with high precision.

When it is judged that the monitor 30 is normally operated, at step S70, the controller 35 controls the selecting unit 32 to apply one cell voltage to the converters 33 and 34. Therefore, the controller 35 receives the first digital value D1out of the TAD converter 33 and the second digital value V2B of the second converter 34. Because of the temperature dependency of the selecting unit 32, the value V2B is changed with the temperature T. At step S80, a second digital value correcting unit 355 (see FIG. 5) of the controller 35 corrects the second digital value V2B of the second converter 34 by using the temperature correction ΔVsel(Tx) and obtains a second corrected digital value V2B'. The value V2B' is obtained by adding the correction ΔVsel(Tx) to the value V2B (V2B'=V2B+ΔVsel(Tx)). Therefore, although the digital value V2B depends on the temperature Tx, the digital value V2B' can indicate the analog level of the cell voltage with high precision while lowering the temperature dependency of the value V2B'.

At step S90, the controller 35 determines an inclination and an intercept of a linear function to determine a correction equation expressed by the linear function. In this correction equation, the first digital value D1out outputted from the TAD converter 33 is indicated by the linear function of an analog cell voltage V1Bx applied to the TAD converter 33. The correction equation is expressed as follows.

$$D1out = A(T) \times V1Bx + B(T) \qquad (1)$$

In other words, the analog cell voltage V1Bx is indicated by a linear function (V1Bx=1/A(T)×D1out−B(T)/A(T)) of the first digital value D1out. The coefficient A(T) indicates an inclination of the linear function and is changed with the temperature T. The coefficient B(T) indicates an intercept of the linear function and is changed with the temperature T. The inclination A(T) indicates the sensitivity of the first digital value flout to a change of the cell voltage V1Bx. Although the first digital value D1out indicates the analog level of the cell voltage with low precision, the controller 35 determines the inclination A(T) and the intercept B(T) such that the digital value (D1out−B(T))/A(T) determined by substituting the first digital value D1out into the correction equation for D1out indicates the analog level of the cell voltage with high precision.

In this embodiment, characteristic lines of the analog to digital conversion of the TAD converter 33, respectively, corresponding to various values of the temperature T are experimentally determined, the characteristic line corresponding to the temperature Tx is determined, a tangential line of the determined characteristic line at the second corrected digital value V2B' of the cell voltage applied to the TAD converter 33 is determined, and the inclination A(T) and the intercept B(T) are determined from the tangential line.

Figure 11:
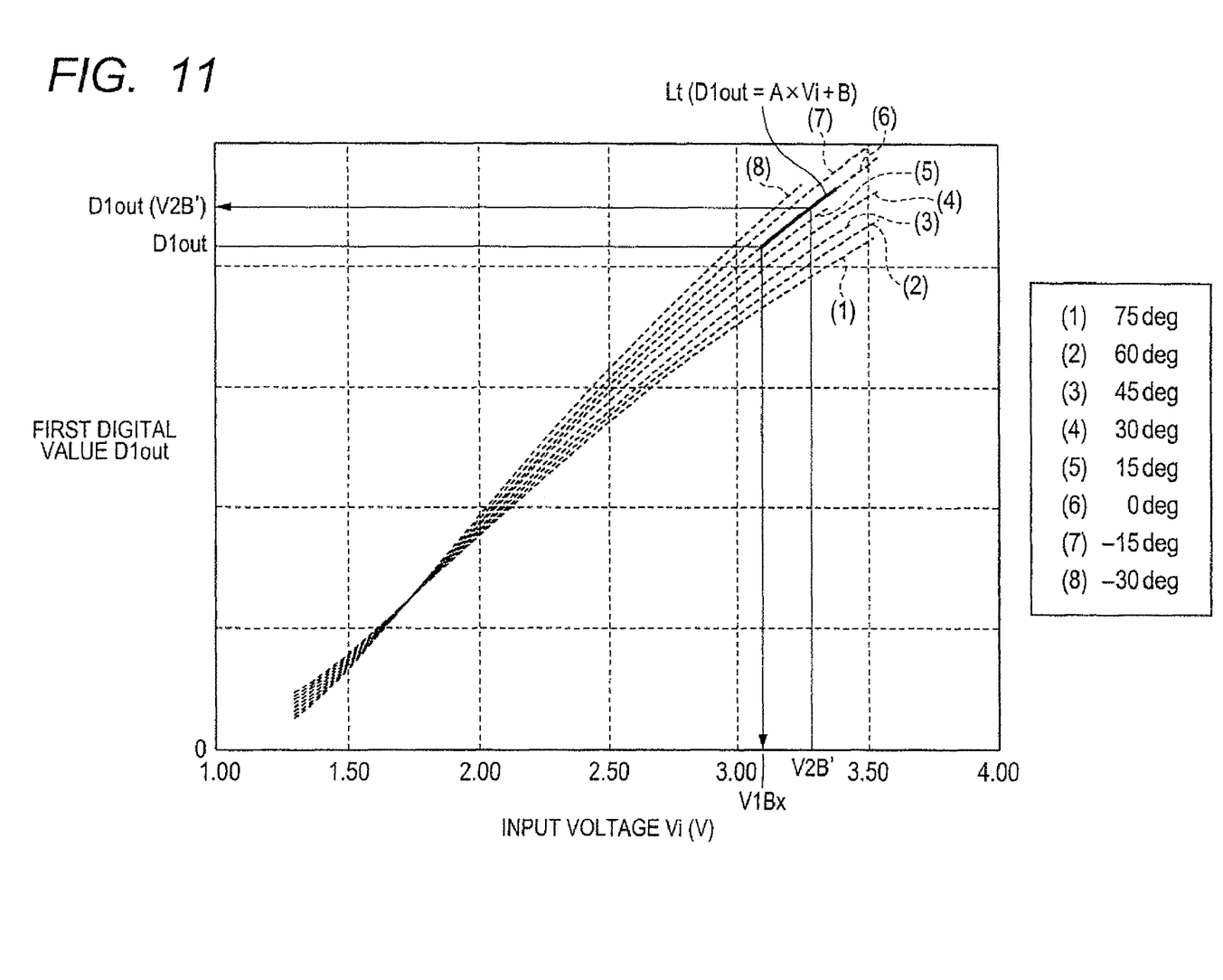
FIG. 11 is a view showing the first digital value nonlinearly changed with the input voltage applied to the TAD converter.

FIG. 11 is a view showing a plurality of characteristic lines of the analog to digital conversion of the TAD converter 33 corresponding to various values of the temperature T. Each characteristic line indicates the nonlinear relation between a voltage Vi set at a known level inputted to the TAD converter 33 and the first digital value D1out outputted from the TAD converter 33. An input voltage Vi set at a known level is applied to the TAD convert 33 while changing the known level with time in a voltage range from 1.30 V to 3.50 V, and the first digital value D1out outputted from the TAD convert 33 is detected for each level of the input voltage Vi. This digital value detecting experiment is performed while changing the atmospheric temperature Tin the range from −30 degrees to 75 degrees. Therefore, as shown in FIG. 11, a characteristic line indicating the first digital value D1out nonlinearly changed with the input voltage Vi is obtained for each value of the temperature T. In FIG. 11, the axis of abscissa indicates the input voltage Vi, while the axis of ordinate indicates the first digital value D1out.

When the atmospheric temperature T is specified, one characteristic line corresponding to the specified atmospheric temperature T is specified. Further, when the input voltage Vi applied to the TAD converter 33 is specified, the inclination of the specified characteristic line at the specified input voltage Vi is determined. This inclination indicates the sensitivity of the first digital value D1out to a change of the input voltage Vi. Therefore, the inclination of the characteristic line can be set as the inclination A of the correction equation.

The second corrected digital value V2B' outputted from the second converter 34 is determined with high precision, so that the value V2B' substantially indicates the analog value of the cell voltage inputted to both the TAD converter 33 and the second converter 34. Therefore, when the value V2B' is used as a reference value of the input voltage Vi applied to the TAD converter 33, the inclination of the characteristic line specified by both the value V2B' of the input voltage Vi and the present temperature Tx denotes the inclination A of the correction equation. For example, when the temperature Tx is equal to zero degree, the characteristic line (6) is specified, and the inclination A(0) of the correction equation is equal to the inclination of the characteristic line (6) at the value V2B' of the input voltage Vi.

Figure 12:
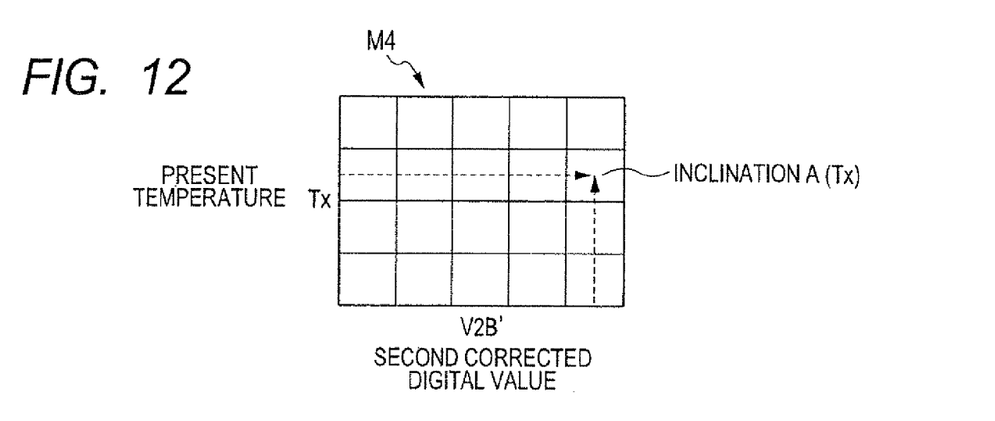
FIG. 12 is a view showing a fourth map used for the correction in the process shown in FIG. 6.

FIG. 12 is a view showing a fourth map M4. The fourth map M4 indicates the relation among the second corrected digital value V2B, the present atmospheric temperature Tx and the inclination A. This map M4 is prepared in advance by determining the inclination A from the characteristic lines shown in FIG. 11 when the input voltage Vi and the temperature T are specified. The map M4 is stored in the memory 39. When the digital value V2B' and the present temperature Tx are determined, the controller 35 can determine the inclination A according to the fourth map M4.

After the determination of the inclination A, the controller 35 determines the intercept B by using the determined inclination A, the digital value V2B' and the first digital value D1out corresponding to the digital value V2B'. More specifically, the digital value V2B' and the first digital value D1out corresponding to the digital value V2B' are substituted into the correction equation (D1out=A×V1Bx+B) for V1Bx and D1out, and the intercept B is determined (B=D1out−A×V2B').

In this embodiment, the controller 35 calculates the intercept B by using the determined inclination A, the value D1out and the value V2B'. However, the fourth map M4 indicating the relation among the value V2B', the temperature Tx, the inclination A and the intercept B may be prepared in advance. In this case, the controller 35 determines the inclination A and the intercept B from the value V2B' and the temperature Tx according to the fourth map M4. As shown in FIG. 11, when one point of one characteristic line is specified by using the value V2B' and the temperature Tx, the intercept B can be determined from the tangential line of the specified characteristic line at the specified point.

Returning to FIG. 6, at step S100, the controller 35 calculates the value V1Bx according to the correction equation by substituting the first digital value D1out, received with the second digital value V2B at step S70, into the correction equation for D1out (V1Bx=(D1out−B)/A). At step S110, the calculated value V1Bx is set as a first corrected digital value. The determination of the correction equation and the calculation of the first corrected digital value are performed every first sampling period. Each first corrected digital value is transmitted to the hybrid controller 12.

Therefore, at steps S90 to S110, the inclination A and the intercept B in the correction equation are determined by using the second corrected digital value V2B' and the first digital value D1out corresponding to the digital value V2B', while considering the temperature Tx, to renew the correction equation every second sampling period. Then, the first digital value D1out corresponding to the digital value V2B' is corrected to the first corrected digital value according to the correction equation every second sampling period, and one or more first digital values D1out obtained in the TAD converter 33 after the second digital value V2B are corrected according to the correction equation recently renewed.

For example, when the converters 33 and 34 receiving the same analog level V2B' of the input signal outputs one first digital value D1out and one second digital value V2B at the temperature Tx, the first digital value D1out is corrected to the first corrected digital value substantially equal to the value V2B' according to the correction equation.

The controller 35 further controls the equalizing unit 37 according to the first corrected digital values V1Bx indicating the voltage levels of the cells 14a. More specifically, the controller 35 monitors the voltage levels of the cells 14a and controls the equalizing unit 37 to equalize the remaining charge quantities or the voltage of the cells 14a with one another. In this control, the controller 35 sets an equalization control signal every first sampling period by using the first corrected digital values V1Bx indicating the voltage levels of all cells 14a, and the equalizing unit 37 equalizes the remaining charge quantities or the voltage levels of the cells 14a according to this signal. However, the controller 35 may set an equalization control signal every second sampling period by using the second corrected digital values V2B' indicating the voltage levels of the cells 14a.

Accordingly, because the voltage level of each cell 14a is converted into the first corrected digital value V1Bx (=(D1out−B)/A) at a high converting speed in the converting unit 40, the voltages of the cells 14a can be detected every short sampling period, as compared with the generally-used converter. That is, the converting unit 40 can detect a change in each cell voltage at high speed.

A correction equation expressed by a linear function is determined by using the nonlinear relation between a known voltage Vi applied to the TAD converter 33 and a digital value outputted from the TAD converter 33 and one second digital value V2B outputted from the second converter 34 such as a ΔΣ type analog to digital converter having a high resolution. More specifically, a characteristic line indicating the nonlinear A/D conversion of the TAD converter 33 is obtained in advance, the inclination A of the correction equation is determined from the inclination of the tangent line Lt of the characteristic line at a point corresponding to the voltage Vi set at the value V2B' corresponding to the second digital value V2B, and the intercept B of the correction equation is determined from the tangent line Lt. In this correction equation, the first digital value D1out is indicated by the linear function of the analog cell voltage V1Bx applied to the TAD converter 33. Then, the voltage V1Bx corresponding to each first digital value D1out in the correction equation is set as a corrected digital value. Therefore, the fist digital value D1out is corrected to the corrected digital value.

Accordingly, as compared with the prior art in which a correction equation is determined by using a large number of master reference voltages outputted from a large number of reference voltage sources, the converting unit 40 can be manufactured at a low cost.

The correction equation is renewed each time the second digital value V2B is outputted from the second converter 34. Because the atmospheric temperature and the cell voltage are hardly changed in one second sampling period, the term corresponding to the atmospheric temperature can be removed from the correction equation, and the term corresponding to a change of the cell voltage can be removed from the correction equation. Accordingly, the correction equation can be simply expressed by a linear function. Further, because of the simplified correction equation, an arithmetic circuit for calculating the corrected digital value according to the correction equation can be downsized.

A plurality of fist digital values obtained in each second sampling period are corrected to corrected digital values according to the same simplified correction equation determined by using the second digital value of the corresponding second sampling period. Accordingly, the corrected digital values can have the linear relation with the voltages of each cell 14a every second sampling period. That is, the converting device 40 can output digital values, indicating the voltages of each cell 14a with sufficiently high precision.

When the correction equation is determined by using the second digital value, the correction equation is determined while considering the present atmospheric temperature Tx (see step S90 of FIG. 6). Therefore, the position indicated by both the input voltage Vi set at the corrected digital value and the first digital value D1out can approach the characteristic line corresponding to the temperature Tx and can be placed on the characteristic line with high precision. Accordingly, even when the temperature T is changed with time, the converting unit 40 can output the corrected digital value indicating the analog level of the cell voltage with high precision.

The second digital value V2B required to determine the correction equation is corrected to the second corrected digital value V2B' while considering the present atmospheric temperature Tx (see step S80 of FIG. 6). Therefore, the position indicated by both the input voltage Vi set at the corrected digital value V2B' and the first digital value D1out can approach the characteristic line corresponding to the temperature Tx and can be placed on the characteristic line with high precision. Accordingly, even when the temperature T is changed with time, the converting unit 40 can output the first corrected digital value indicating the analog level of the cell voltage with high precision.

The corrected reference voltage V2ref' is obtained by correcting the second reference digital voltage V2ref while considering the present atmospheric temperature Tx, and the correction of each first digital value D1out is performed when the voltage V2ref' is placed between tolerance limits. Therefore, when the second reference digital voltage V2ref is placed out of its normal range, the converting unit 40 can prohibit the correction of each first digital value on the basis of the second reference digital voltage V2ref.

Because the temperature dependency of the first digital value outputted from the TAD converter 33 is higher than the temperature dependency of the second digital value outputted from the second converter 34, the present atmospheric temperature Tx is determined from the reference digital value Dref outputted from the TAD converter 33 when the reference voltage Vref set at a known level is applied to the TAD converter 33. Accordingly, the converting unit 40 can precisely determine the temperature Tx without any temperature sensor.

MODIFICATIONS

This embodiment should not be construed as limiting the present invention to structures of the embodiment, and the structure of this invention may be combined with that based on the prior art.

For example, in the embodiment, the second converter 34 is formed of a generally-used ΔΣ type analog to digital converter. However, the second converter 34 may be formed of a successive approximation type analog to digital converter or a cyclic analog to digital converter generally-used.

In the embodiment, the first converter 33 is formed of a time analog to digital converter. As compared with the second converter 34, the first converter 33 outputs the first digital values by short sampling periods, and the precision of the first digital values is low because of the high temperature dependency and the low linearity in the analog to digital converting characteristic. However, the first converter 33 may be formed of a ΔΣ type analog to digital converter, a successive approximation type analog to digital converter, acyclic analog to digital converter or the like on condition that the first converter 33 outputs the first digital values by short sampling periods, at the high temperature dependency and at the low linearity, as compared with the second converter 34. Therefore, it is desired that a change of the first digital value with respect to the atmospheric temperature T is larger than a change of the second digital value with respect to the atmospheric temperature T. Further, it is desired that the first sampling period is shorter than one millisecond, while the second sampling period may be equal to or longer than one millisecond.

In this embodiment, the present atmospheric temperature Tx is estimated from the first reference digital value Dref(Tx) of the TAD converter 33 having the high temperature dependency (see step S30 of FIG. 6). However, the converting device 40 may have a temperature sensor to directly detect the temperature Tx. In this case, the reference voltage source 38 can be omitted.

In this embodiment, the correction equation is determined by using the second corrected digital value V2B' and the present atmospheric temperature Tx (see step S90 of FIG. 6). However, the correction equation may be determined by using the digital value V2B' without considering the temperature T.

In this embodiment, the converting unit 40 is used for the hybrid vehicle, having both the battery 14 and an internal combustion engine (not shown) as a vehicle running power source, to detect the voltage of each cell 14a of the battery 14. However, the converting unit 40 may be used for an electric vehicle, having a high voltage battery as a vehicle running power source, to detect the voltage of each cell of the battery.

In this embodiment, the second sampling period Ts2 is set to be a multiple of the first sampling period Ts1. However, the period Ts2 is allowed not to be a multiple of the period Ts1. In this case, although the converters 33 and 34 perform the conversions at different timings, the controller 35 corrects the first digital values on the basis of the second digital value, recently obtained, while the second digital value is renewed every second sampling period.

In this embodiment, when the corrected reference voltage V2ref' substantially having no temperature dependency is placed between the tolerance limits L1' and L2', the controller 35 judges that the monitor 30 is normally operated (see step S60 of FIG. 6). However, when the reference voltage V2ref is placed between the tolerance limits L1 and L2, the controller 35 may judge that the monitor 30 is normally operated.

What is claimed is:

1. An analog to digital converting device comprising:
 a first analog to digital converter that can convert an analog level of an input signal into a first digital value every first sampling period of time shorter than a second sampling period of time;
 a second analog to digital converter that can convert the analog level of the input signal into a second digital value every second sampling period such that the second digital value indicates the analog level with a precision higher than a precision of the first digital value indicating the analog level;
 a correction equation determining unit that determines a correction equation by using the second digital value each time the second digital value is obtained in the second analog to digital converter; and
 a correcting unit that corrects each of the first digital values, obtained in the first analog to digital converter in one second sampling period, to a corrected digital value according to the correction equation, determined by the correction equation determining unit by using the second digital value obtained in the second sampling period, every second sampling period and outputs the corrected digital values as digital values determined from the input signal.

2. The converting device according to claim 1, wherein the correction equation is expressed by a linear function so as to indicate a voltage level of an analog signal inputted to the first analog to digital converter by the linear function of a digital value outputted from the first analog to digital converter, the correction equation determining unit determines a relation between the voltage level and the digital value and determines an inclination and an intercept of the linear function by using the second digital value and the determined relation every second sampling period, and the correcting unit sets the voltage level, obtained by substituting the first digital value into the correction equation for the digital value, as the corrected digital value.

3. The converting device according to claim 1, further comprising:
 a temperature determining unit that determines a temperature of an atmosphere surrounding the converting device every second sampling period,
 wherein the correction equation determining unit determines the correction equation by using the second digital value and the determined temperature every second sampling period.

4. The converting device according to claim 1, further comprising:
 a temperature determining unit that determines a temperature of an atmosphere surrounding the converting device every second sampling period; and
 a second digital value correcting unit that corrects the second digital value according to the determined temperature every second sampling period.

5. The converting device according to claim 1, further comprising:
 a reference voltage source that outputs a master reference voltage set at a known level; and
 a temperature determining unit that applies the master reference voltage to the first analog to digital converter, which can output the first digital value having a temperature dependency larger than a temperature dependency of the second digital value of the second analog to digital converter, to obtain a first reference digital value every second sampling period, and determines a temperature of an atmosphere surrounding the converting device from the first reference digital value every second sampling period,
 wherein the correction equation determining unit determines the correction equation by using the second digital value and the determined temperature every second sampling period.

6. The converting device according to claim 1, further comprising:
a reference voltage source that outputs a master reference voltage set at a known level;
a temperature determining unit that applies the master reference voltage to the first analog to digital converter, which can output the first digital value having a temperature dependency larger than a temperature dependency of the second digital value of the second analog to digital converter, to obtain a first reference digital value from the first analog to digital converter every second sampling period, and determines a temperature of an atmosphere surrounding the converting device from the first reference digital value every second sampling period; and
a second digital value correcting unit that corrects the second digital value according to the determined temperature every second sampling period.

7. The converting device according to claim 1, further comprising:
a reference voltage source that outputs a master reference voltage set at a known level; and
a correction allowing unit that applies the master reference voltage to the second analog to digital converter to obtain a second reference digital value from the second analog to digital converter and allows the correction of the first digital values performed by the correcting unit every second sampling period when the second reference digital value is placed between tolerance limits.

8. The converting device according to claim 7, further comprising:
a temperature determining unit that determines a temperature of an atmosphere surrounding the converting device every second sampling period,
wherein the level of the master reference voltage outputted from the reference voltage source depends on the atmospheric temperature, the correction allowing unit corrects the second reference digital value to a corrected reference digital value according to the determined temperature every second sampling period and allows the correction of the first digital values performed by the correcting unit when the corrected reference digital value is placed between the tolerance limits.

9. The converting device according to claim 1, wherein the first analog to digital converter is a time analog to digital converter, and the second analog to digital converter is a converter such as a $\Delta\Sigma$ type analog to digital converter, a successive approximation type analog to digital converter or a cyclic analog to digital converter.

10. The converting device according to claim 1, wherein the first analog to digital converter has a nonlinear analog to digital characteristic so as to nonlinearly convert the analog level of the input signal into the first digital value, and the second analog to digital converter has a linear analog to digital characteristic so as to substantially linearly convert the analog level of the input signal into the second digital value.

11. The converting device according to claim 1, wherein the first digital value of the first analog to digital converter has a temperature dependency larger than a temperature dependency of the second digital value of the second analog to digital converter.

12. The converting device according to claim 1, wherein the correction equation determining unit uses the second digital value as a value of a reference voltage to be inputted to the first analog to digital converter, and determines the correction equation such that the correcting unit corrects the first digital value, obtained at the same timing as a timing of the second digital value, to the corrected digital value which is equal to the value of the reference voltage.

* * * * *